United States Patent
Tang et al.

(10) Patent No.: US 11,900,197 B1
(45) Date of Patent: Feb. 13, 2024

(54) SYSTEMS-IN-PACKAGES HAVING MULTIPLE SHIELDING COMPONENTS

(71) Applicant: Amazon Technologies, Inc., Seattle, WA (US)

(72) Inventors: Kun Tang, Shenzhen (CN); Fubin Song, Hong Kong (HK); Chaoran Yang, Shenzhen (CN)

(73) Assignee: Amazon Technologies, Inc., Seattle, WA (US)

( * ) Notice: Subject to any disclaimer, the term of this patent is extended or adjusted under 35 U.S.C. 154(b) by 82 days.

(21) Appl. No.: 17/483,171

(22) Filed: Sep. 23, 2021

(51) Int. Cl.
| | |
|---|---|
| *G06K 19/07* | (2006.01) |
| *H01L 23/552* | (2006.01) |
| *H01L 25/065* | (2023.01) |
| *H01L 21/56* | (2006.01) |
| *H01L 25/10* | (2006.01) |
| *H02J 50/10* | (2016.01) |
| *H01Q 1/22* | (2006.01) |
| *G06K 19/077* | (2006.01) |
| *H02J 50/70* | (2016.01) |

(52) U.S. Cl.
CPC ... *G06K 19/0723* (2013.01); *G06K 19/07773* (2013.01); *H01L 21/561* (2013.01); *H01L 23/552* (2013.01); *H01L 25/0655* (2013.01); *H01L 25/105* (2013.01); *H01Q 1/2225* (2013.01); *H01Q 1/2283* (2013.01); *H02J 50/10* (2016.02); *H02J 50/70* (2016.02); *H01L 2225/1023* (2013.01); *H01L 2225/1047* (2013.01); *H01L 2225/1058* (2013.01)

(58) Field of Classification Search
CPC .................................................. G06K 19/0723
See application file for complete search history.

(56) References Cited

U.S. PATENT DOCUMENTS

| | | | |
|---|---|---|---|
| 2007/0096293 A1* | 5/2007 | Wen | H01L 25/072 257/E23.101 |
| 2017/0170676 A1* | 6/2017 | Cheah | H01L 25/18 |

* cited by examiner

*Primary Examiner* — Rafferty D Kelly
(74) *Attorney, Agent, or Firm* — Eversheds Sutherland (US) LLP

(57) ABSTRACT

Systems and methods are disclosed for systems-in-packages that have multiple shielding components. In one embodiment, a system-in-package may include a substrate, an integrated circuit package disposed on the substrate, a system-on-a-chip disposed on the substrate, and a molding compound disposed over the integrated circuit package and the system-on-a-chip. The system-in-package may include a first electromagnetic interference shielding component disposed about the molding compound, and a second electromagnetic interference shielding component that at least partially forms an outer surface of the system-in-package. The second electromagnetic interference shielding component may have a patterned structure formed thereon.

20 Claims, 7 Drawing Sheets

SYSTEMS-IN-PACKAGES HAVING MULTIPLE SHIELDING COMPONENTS

BACKGROUND

Electronic devices may include various components, such as wireless charging coil components, antenna components, and so forth. Individual component assemblies may consume space inside a device, resulting in increased device footprints and/or sizes. For example, a discrete wireless charging coil component may be positioned on a circuit board of a device and may therefore cause a footprint of the device to expand. However, devices with compact footprints or reduced thickness may be desired. Accordingly, systems-in-packages that have multiple shielding components may be desired.

Figure 1:
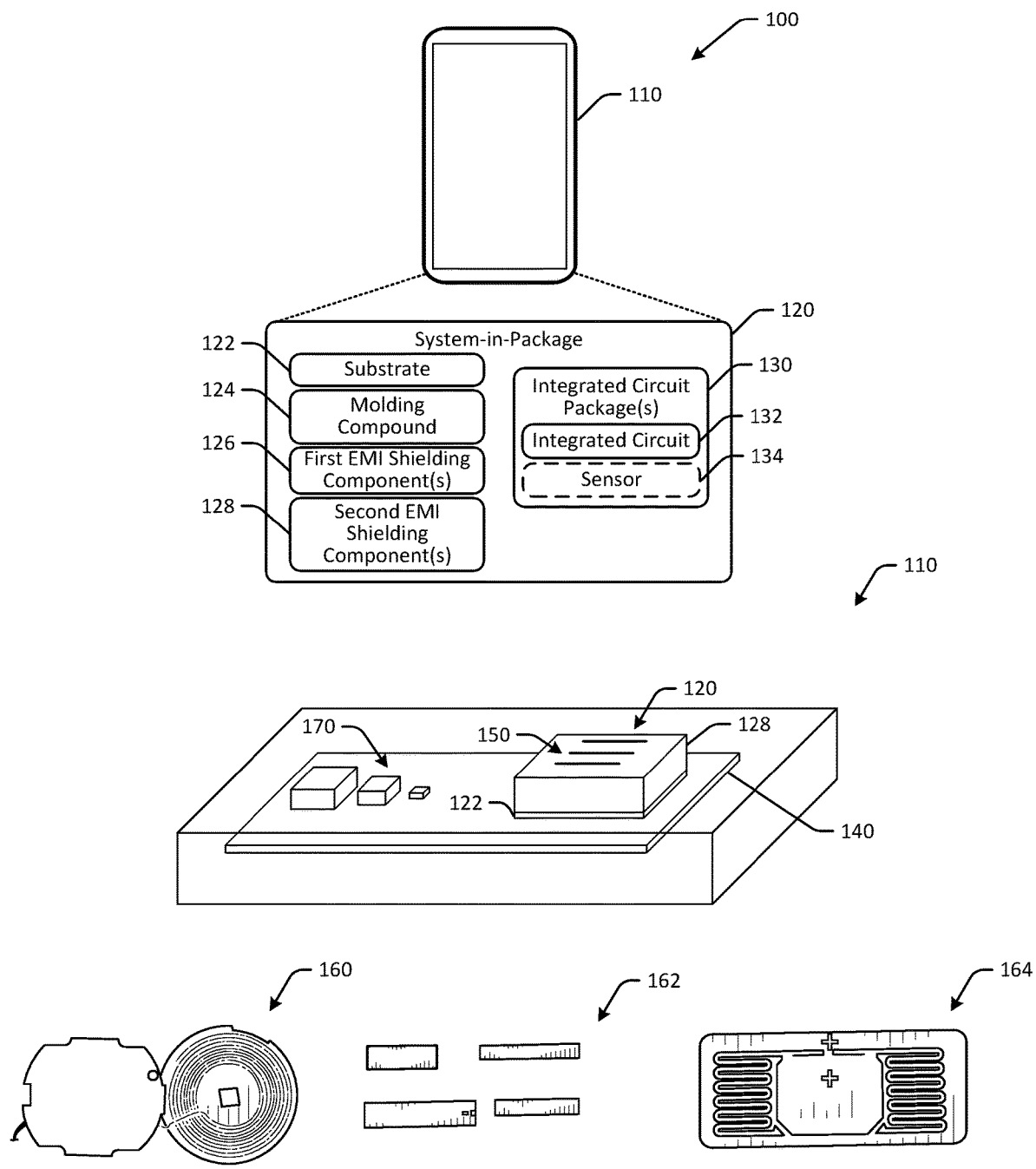
FIG. 1 is a schematic illustration of an example use case of a system-in-package having multiple shielding components in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Electronic devices may be used to consume content. Some electronic devices may include various features, such as wireless charging functionality, radio-frequency identification (RFID) functionality, Near Field Communication (NFC) and other antenna-based functionality, and other types of features. To implement such features, devices may include various components, such as wireless charging coils, antenna modules, and so forth. Discrete components may consume physical space within a device, which may impact not only height and width dimensions of the device, but a thickness of the device as well. In addition, manufacturing complexity may be increased, and device durability may be decreased. Some devices may include system-in-package components. A system-in-package may be a number of integrated circuits and/or other components that are enclosed in one or more chip carrier packages. Some systems-in-packages may include sensors. Systems-in-packages may provide flexibility in electronic device layout, such as by allowing for systems-in-packages to reduce device footprint. In addition, systems-in-packages may be complete functional units that can reduce device complexity.

Embodiments of the disclosure include systems-in-packages that include integrated additional components, such as wireless charging coils, antennas, and other structures, such that additional separate discrete components are not needed, thereby reducing the amount of space consumed by components inside a device, reducing device footprint, decreasing manufacturing complexity, and reducing device costs. For example, some embodiments include systems-in-packages with additional electromagnetic shielding layers on which patterned structures, such as coil patterns, antenna patterns, and so forth, can be formed. By including additional electromagnetic shielding layers, such patterned structures can be integrated with systems-in-packages, without impacting system-in-package performance. Some embodiments include an additional electromagnetic shielding layer separated from an original electromagnetic shielding layer of the system-in-package by an insulation layer. The additional electromagnetic shielding layer can be modified to include various patterned structures and/or other components, such as RFID tags or radio components. The patterned structures may be electrically coupled to a circuit of the system-in-package using conductive connector components, such as copper pillars. As a result, certain standalone components may not be needed. Other embodiments include different structural designs and components, as discussed herein. Some embodiments may use electromagnetic interference coatings to form electromagnetic shielding layers.

Embodiments of the disclosure include systems-in-packages that have multiple shielding components. Unlike typical systems-in-packages, certain embodiments may include more than one electromagnetic shielding layer. Patterned structures may be formed on an outer electromagnetic shielding layer. The patterned structures may be coupled to a circuit of the system-in-package using one or more connectors that are insulated from an inner electromagnetic shielding layer. Connectors may be conductive components, and may optionally be formed of copper. Embodiments of the disclosure may be used in any suitable electronic device, such as smartphones or other mobile devices, wearables, Internet of Things devices, and the like.

This disclosure relates to, among other things, systems, methods, computer-readable media, techniques, and methodologies for systems-in-packages that have multiple shielding components. Embodiments may include systems-in-packages with additional integrated components, so as to provide a reduced footprint and improved device durability. Some embodiments may improve performance and increase functionality of systems-in-packages, while potentially reducing propensity for damage.

Referring to FIG. 1, an example use case 100 of a device 110 with a system-in-package having multiple shielding components is depicted in accordance with one or more embodiments of the disclosure. The device 110 may be any suitable electronic device, such as a smartphone, an e-reader, a tablet, an audio or video streaming device, an Internet of Things device, a product ordering button or device, a home sensor, an aging in place device, an earphone, a speaker device, or another device. In the example of FIG. 1, the device 110 may be a smartphone with a touch display.

The device 110 may include one or more systems-in-packages 120. The system-in-package 120 may include a number of components, such as chips, including processors and/or memory, passive components, including resistors and/or capacitors, and/or other components that may be mounted on a substrate 122. In the example of FIG. 1, the substrate 122 may be a circuit board or other substrate. The system-in-package 120 may include additional components, such as a molding compound 124 that at least partially surrounds the components disposed on the substrate 122, one or more optional passive components, such as resistors and/or capacitors, a first electromagnetic interference shielding component 126, and a second electromagnetic interference shielding component 128. The first electromagnetic interference shielding component 126 may be an inner electromagnetic interference shielding component, and the second electromagnetic interference shielding component 128 may be an outer electromagnetic interference shielding component, where the second electromagnetic interference shielding component 128 at least partially forms an outer surface of the system-in-package 120. The system-in-package 120 may include one or more integrated circuit packages 130.

Integrated circuit packages 130 may include one or more components, such as an integrated circuit 132 (which may include a number of semiconductors), and one or more optional sensors 134. The sensor 134 may be any suitable sensor, including, but not limited to, a microphone, a temperature sensor, humidity sensors, a pressure sensor, a camera, an optical sensor, a gas sensor, and/or other sensors or other component, such as a vibration motor.

The integrated circuit package 130 may be disposed on the substrate 122. The integrated circuit package 130 may have an upper surface and a lower surface, where the lower surface is coupled to the substrate 122. The integrated circuit package 130 may include the sensor 134, which may be one or more of a temperature sensor, a humidity sensor, a pressure sensor, an ambient light sensor, a microphone, a gas sensor, or a different type of sensor.

The molding compound 124 may be disposed on the substrate 122. The molding compound 124 may be any suitable molding compound and may be formed of a material such as a thermosetting material, thermoplastic material, or polymer-based material. Other materials may be used. The molding compound 124 may at least partially surround or otherwise encompass components disposed on the substrate 122. For example, the integrated circuit package 130 may be partially or fully embedded in the molding compound 124. In other embodiments, an optional semiconductor chip may be embedded in the molding compound 124. The first electromagnetic interference shielding component 126 may be disposed around the molding compound 124. For example, the first electromagnetic interference shielding component 126 may encompass or encapsulate at least some of the molding compound 124. An insulation layer may be disposed about the first electromagnetic interference shielding component 126. The second electromagnetic interference shielding component 128 may be disposed about the insulation layer, as discussed with respect to FIG. 2.

The device 110 is illustrated in a schematic perspective view in FIG. 1. The device 110 may include a flexible printed circuit 140. The system-in-package 120 may be coupled to a first side of the flexible printed circuit 140. The device 110 may include a number of additional components 170, such as prepackaged integrated circuits, passive components, etc. that are coupled to the first side of the flexible printed circuit 140. The device 110 may include optional metal stiffeners or other metal components configured to provide rigidity to portions of the flexible printed circuit 140.

The second electromagnetic interference shielding component 128 may include one or more patterned structures 150 disposed thereon, such as on a top surface or upper surface ("top," "bottom," "lower," and "upper" as used herein are to describe relative positioning, and not absolute positioning). The patterned structure 150 is depicted as a number of lines in FIG. 1, but may be formed in various patterned structures using etching or other processes, and may include patterns such as wireless charging coil patterned structures, antenna patterned structures, RFID patterned structures, and/or other patterned structures.

By incorporating patterned structures 150 on the second electromagnetic interference shielding component 128, separate components may no longer be needed. For example, if the patterned structure 150 is a wireless charging coil patterned structure, a separate wireless charging coil 160 may not be needed. In another example, if the patterned structure 150 is a radio frequency antenna patterned structure, a separate antenna structure 162 may not be needed. In another example, if the patterned structure 150 is an RFID antenna patterned structure, a separate RFID component 164 may not be needed.

Example embodiments of the disclosure provide a number of technical features or technical effects. For example, in accordance with example embodiments of the disclosure, certain embodiments of the disclosure may include systems-in-packages with improved functionality, thereby facilitating increased component density and improved performance for components and devices. Some embodiments may include integrated antennas and systems-in-packages. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 2:
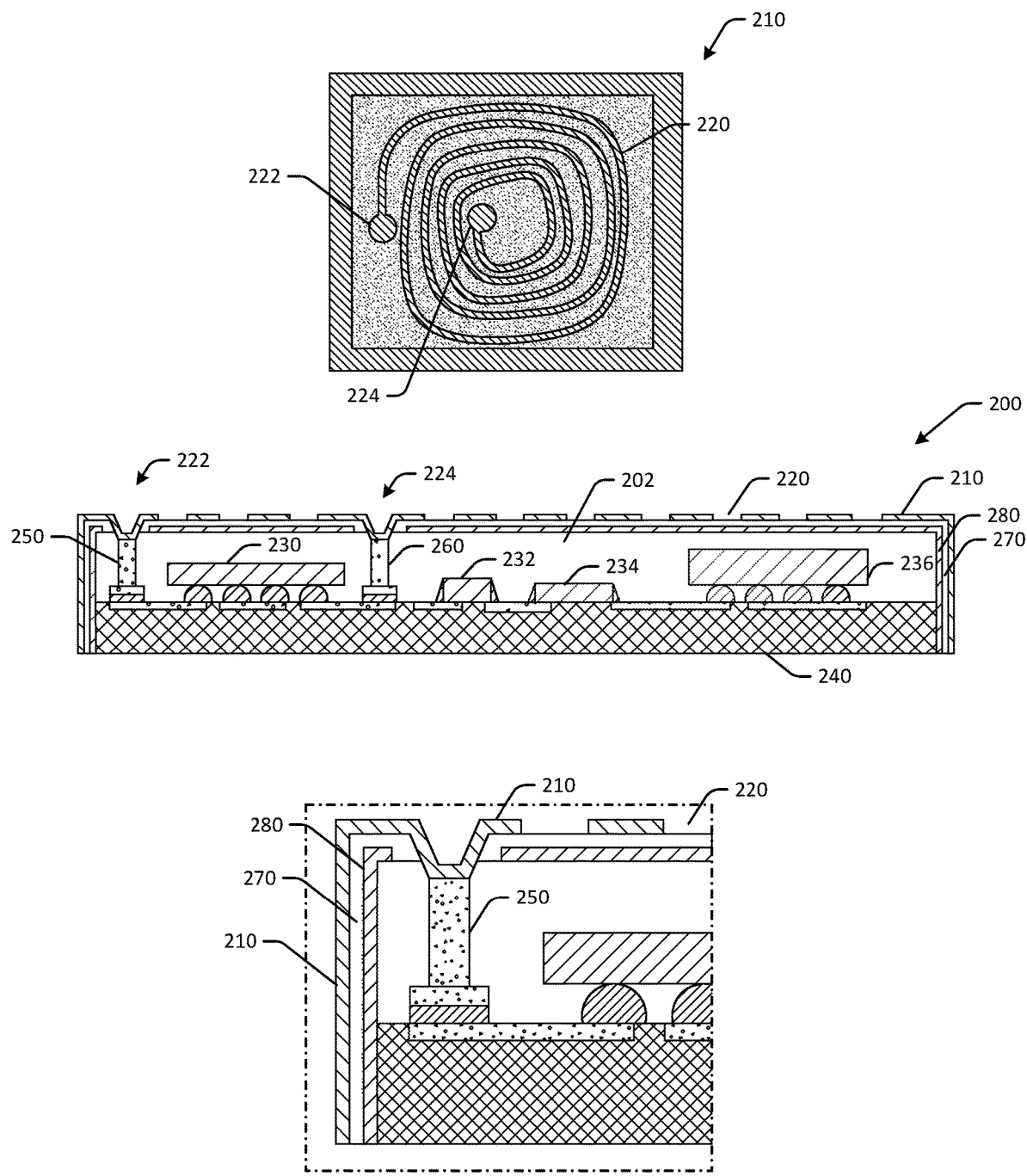
FIG. 2 is a schematic illustration of an example system-in-package having a wireless charging coil patterned structure in various views in accordance with one or more embodiments of the disclosure.

Referring to FIG. 2, a schematic drawing of an example system-in-package 200 having a wireless charging coil patterned structure is depicted in various views in accordance with one or more embodiments of the disclosure. Other embodiments may include additional or fewer components. Other embodiments may have a different patterned structure than that depicted in the example of FIG. 2.

In FIG. 2, the system-in-package 200 is depicted in top view, cross-sectional view, and close-up cross-sectional view. The system-in-package 200 may include an integrated wireless charging coil patterned structure disposed on an electromagnetic interference shielding layer, as described herein. The system-in-package 200 may be disposed inside a device housing, which may be formed of any suitable material, such as glass, plastic, rubber, composite, or a different type of material. For example, the device may include a flexible printed circuit. The flexible printed circuit may be arranged in a planar, flat, or unfolded configuration. The flexible printed circuit may include a number of conductive traces bonded on a flexible substrate. A number of components may be disposed on the flexible printed circuit, such as the system-in-package 200. The system-in-package 200 may be electrically coupled to the flexible printed circuit or other device component.

The system-in-package 200 may include a number of components. For example, the system-in-package 200 may include a substrate 240, such as a printed circuit board, a flexible circuit board, or other type of substrate. The system-in-package 200 may include one or more integrated circuit packages, such as a system-on-a-chip 236, one or more power management integrated circuits 232, one or more passive components 234, one or more wireless charging integrated circuits 230, and/or other components, such as flip chip integrated circuits that are positioned on the substrate 240. A flip chip integrated circuit may be used to facilitate connections to other components of a device, such as other semiconductor components.

The system-in-package 200 may include a molding compound 202 disposed over the system-on-a-chip 236, the power management integrated circuit 232, and/or the other components disposed on the substrate 240, such as the one or more passive components 234 and the one or more wireless charging integrated circuit 230. Accordingly, the components on the substrate 240 may be embedded in the molding compound 202. The molding compound 202 may be formed of a material such as a thermosetting material, thermoplastic material, or polymer-based material. The molding compound 202 may encompass or encapsulate the components of the system-in-package 200 that are disposed on the substrate 240.

The system-in-package 200 may include a first electromagnetic interference shield 280 disposed around an outer surface of the molding compound 202. The first electromagnetic interference shield 280 may be a fence, coating, or other component formed of a metal material and configured to prevent electromagnetic interference. The first electromagnetic interference shield 280 may form a layer around the molding compound 202. In some embodiments, the first electromagnetic interference shield 280 may be formed of more than one component, while in other embodiments, the first electromagnetic interference shield 280 may be a contiguous shield or single piece assembly. In some embodiments, the first electromagnetic interference shield 280 may have a multi-layer structure, such as a copper sublayer disposed between two steel sublayers. In other embodiments, the first electromagnetic interference shield 280 may have a single layer structure. The first electromagnetic interference shield 280 may be an inner electromagnetic interference shield.

The system-in-package 200 may include an insulation layer 270 disposed about the first electromagnetic interference shield 280. The insulation layer 270 may be formed of a non-conductive material, such as epoxy, molding compound, or another suitable material, and may separate the first electromagnetic interference shield 280 from other components, such as an outer electromagnetic interference shield. In some embodiments, the insulation layer 270 may be formed via an over-molding process.

The system-in-package 200 may include a second electromagnetic interference shield 210. The second electromagnetic interference shield 210 may be disposed about or around the insulation layer 270. The second electromagnetic interference shield 210 may form an outer layer of the system-in-package 200. The second electromagnetic interference shield 210 may be a fence, coating, or other component formed of a metal material and configured to prevent electromagnetic interference. The second electromagnetic interference shield 210 may form a layer around the insulation layer 270. In some embodiments, the second electromagnetic interference shield 210 may be formed of more than one component, while in other embodiments, the second electromagnetic interference shield 210 may be a contiguous shield or single piece assembly. In some embodiments, the second electromagnetic interference shield 210 may have a multi-layer structure, such as a copper sublayer disposed between two steel sublayers. In other embodiments, the second electromagnetic interference shield 210 may have a single layer structure and may be formed of, for example, copper. The second electromagnetic interference shield 210 may be an outer electromagnetic interference shield or may form an outer surface of the system-in-package 200.

A patterned structure 220 may be formed on the second electromagnetic interference shield 210. As depicted in the top view of the second electromagnetic interference shield 210 in FIG. 2, the patterned structure 220 may include a wireless charging coil patterned structure. The patterned structure 220 may include a coil pattern that starts at a first cavity 222 formed in the second electromagnetic interference shield 210 and ends at a second cavity 224 formed in the second electromagnetic interference shield 210. The patterned structure 220 may be formed using etching (e.g., chemical etching, etc.), laser, or another suitable process. The patterned structure 220 may form openings or gaps in the second electromagnetic interference shield 210 by extending through a thickness of the second electromagnetic interference shield 210, as visible in the cross-sectional view in FIG. 2.

A thickness of the second electromagnetic interference shield 210 may vary depending on the patterned structure 220 formed thereon and the related application, as well as the material used for the second electromagnetic interference shield 210. For example, for wireless charging, the second electromagnetic interference shield 210 may have a thickness of at least about 4-5 microns or greater. Other embodiments may have different thicknesses and/or may be formed of different materials.

In some embodiments, the first electromagnetic interference shield 280 may have a first thickness that is less than a second thickness of the second electromagnetic interference shield 210, whereas in other embodiments, the first electromagnetic interference shield 280 may have a first thickness that is greater than a second thickness of the second electromagnetic interference shield 210.

The system-in-package 200 may include one or more connectors to electrically couple the patterned structure 220 on the second electromagnetic interference shield 210 to one or more circuits on the substrate 240. For example, the system-in-package 200 may include a first connector 250 that extends between the patterned structure 220 of second electromagnetic interference shield 210 and the substrate 240. The first connector 250 may be formed of a conductive material, such as copper. The first connector 250 may be disposed adjacent to the first cavity 222. The first connector 250 may be mounted using a selective molding or surface mount technology process, as described with respect to FIGS. 3-4. The first connector 250 may form an interconnection between the circuit on the substrate 240 and the patterned structure 220 on the second electromagnetic interference shield 210. The first connector 250 may be disposed in, or otherwise pass through, the molding compound 202. As depicted in the close-up view in FIG. 2, the first connector 250 may be insulated from contact with the first electromagnetic interference shield 280 by the molding compound 202 and/or the insulation layer 270.

The system-in-package 200 may include a second connector 260 that extends between the second electromagnetic interference shield 210 and the substrate 240. The second connector 260 may be formed of a conductive material, such as copper. The second connector 260 may be disposed adjacent to the second cavity 224. The second connector 260 may be mounted using a selective molding or surface mount technology process, as described with respect to FIGS. 3-4. The second connector 260 may form an interconnection between the circuit on the substrate 240 and the patterned structure 220 on the second electromagnetic interference shield 210. The second connector 260 may be disposed in, or otherwise pass through, the molding compound 202. The wireless charging coil pattern may extend from a starting point adjacent to the first connector 250 to an ending point adjacent to the second connector 260. The first cavity 222 may therefore be aligned with the first connector 250, and the second cavity 224 may be aligned with the second connector 260.

The system-in-package 200 may include an optional cover layer disposed over the second electromagnetic interference shield 210. The cover layer may be for protective purposes and may be formed as a plastic film, a tape, etc. to isolate the patterned structure 220 from an ambient environment.

Accordingly, the embodiment of the system-in-package 200 depicted in the example of FIG. 2 may provide integrated wireless charging functionality to a device without a separate wireless charging coil assembly. Therefore, in some embodiments, a system-in-package may include the substrate 240, one or more integrated circuit package disposed on the substrate 240, one or more system-on-a-chip(s) disposed on the substrate 240, and the molding compound 202 disposed over the integrated circuit package and the system-on-a-chip. The system-in-package 200 may include a first electromagnetic interference shielding component, such as the first electromagnetic interference shield 280, disposed about the molding compound 202, wherein the first electromagnetic interference shielding component has a multi-layer structure, and a second electromagnetic interference shielding component, such as the second electromagnetic interference shield 210, that at least partially forms an outer surface of the system-in-package 200. The second electromagnetic interference shielding component may have a patterned structure formed thereon. The second electromagnetic interference shielding component may have a single-layer structure in some instances.

Figure 3:
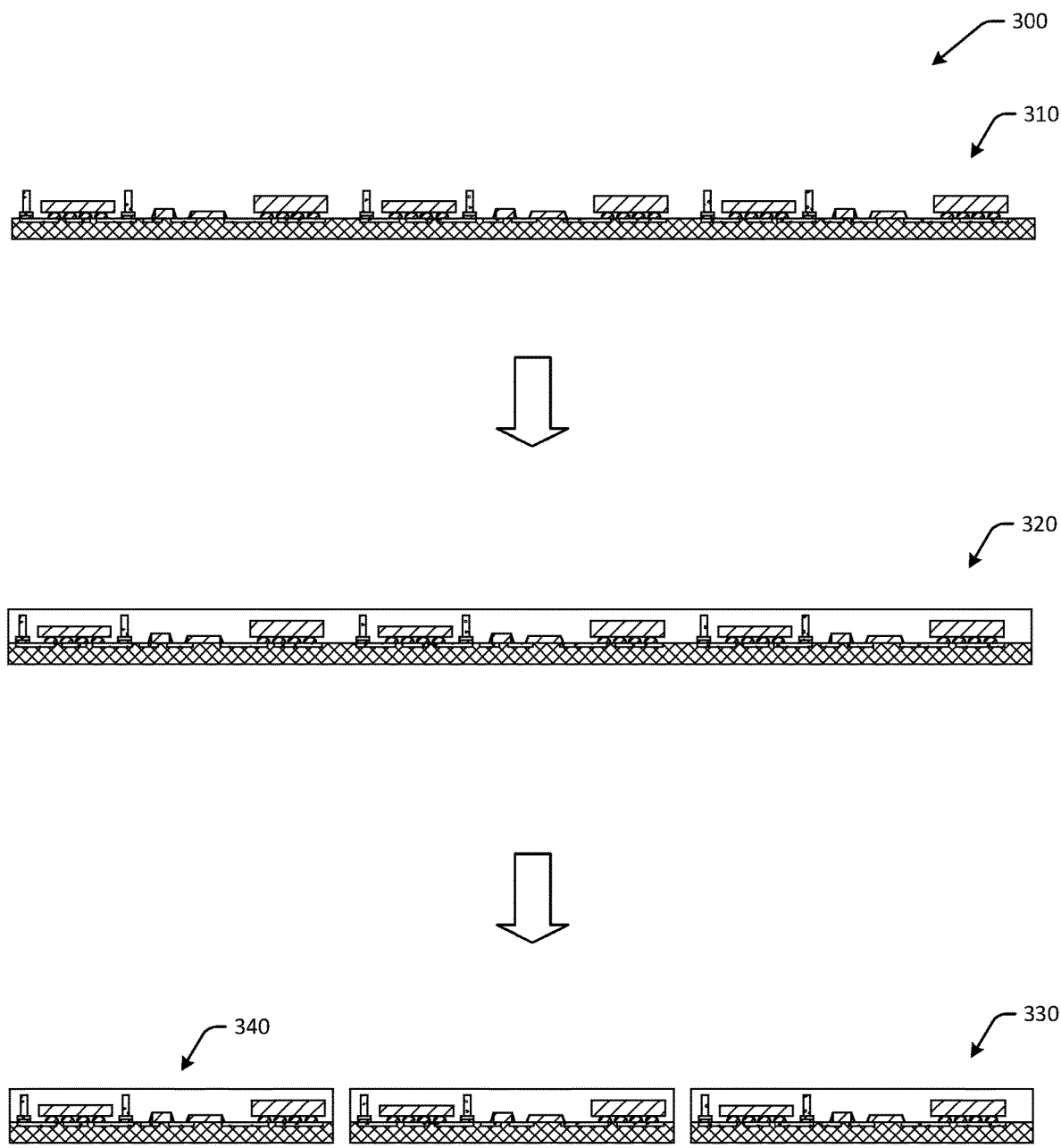
FIGS. 3-4 are schematic illustrations of an example formation process for systems-in-packages having multiple shielding components in accordance with one or more embodiments of the disclosure.
Figure 4:
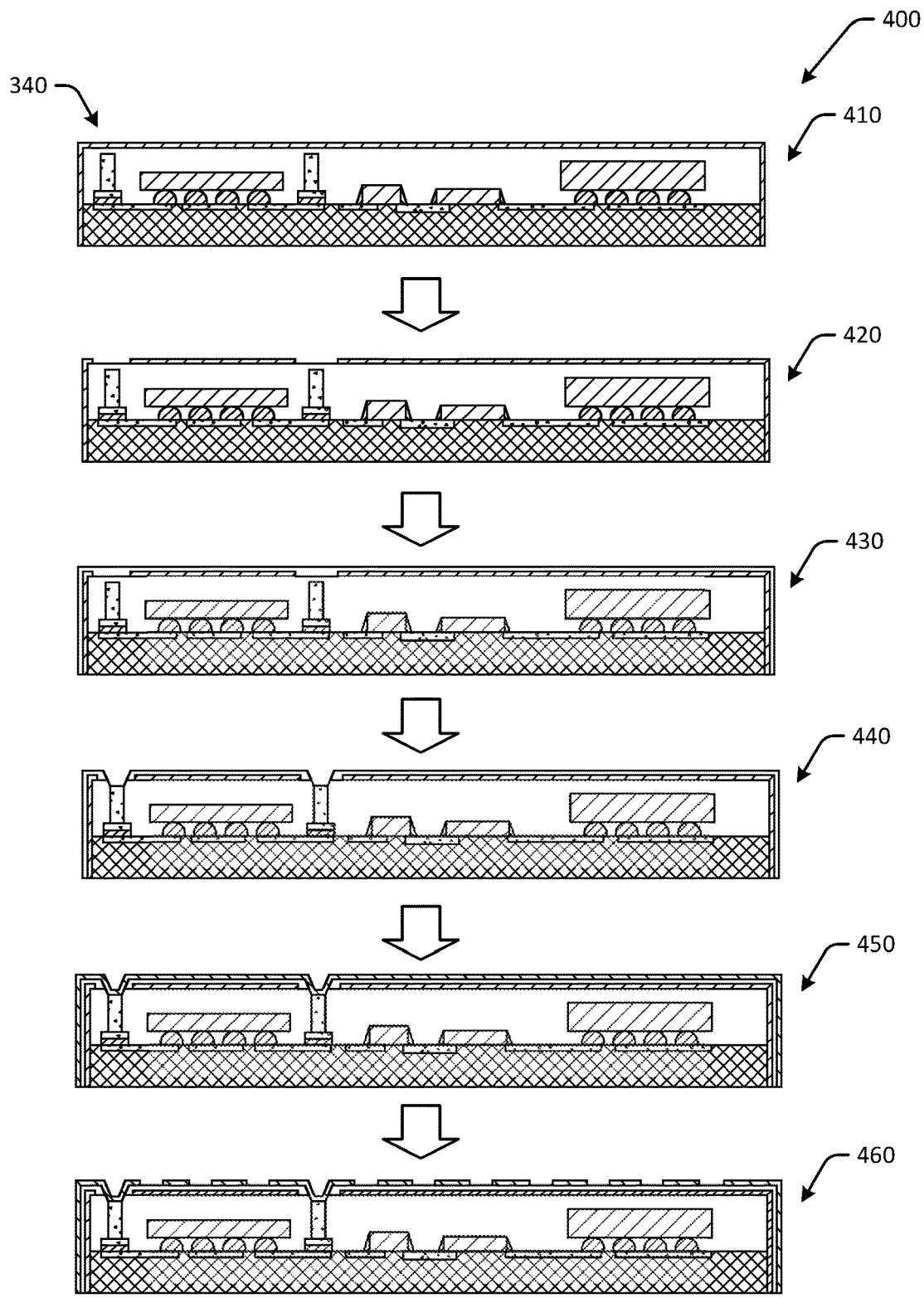

FIGS. 3-4 are schematic illustrations of an example process of forming systems-in-packages having multiple shielding components in accordance with one or more embodiments of the disclosure. Other embodiments may use a different process than that illustrated in FIGS. 3-4. Additional or fewer operations may be included.

At a first operation 310, connectors, integrated circuits, and/or other components may be mounted to a substrate in preparation for an overmolding or a selective molding process. At a second operation 320, an overmolding or a selective molding process may be used to apply molding compound over the components on the substrate. The molding compound may encapsulate the components on the substrate. In one example, molding tooling may be used, where molding compound may be injected into the tooling during the overmolding or selective molding process.

At a third operation 330, a singulation process may be performed to segment the respective assemblies into discrete partially completed systems-in-packages 340. The singulation process may include separating the individual systems-in-packages using a blade or other tool.

In FIG. 4, the individual system-in-package 340 may be processed using an individual process 400. At a first operation 410, a first electromagnetic interference shielding layer may be applied to the system-in-package 340. The first electromagnetic interference shielding layer may be mounted, sprayed, coated, or otherwise disposed on the molding compound.

At a second operation 420, patterning, such as laser or chemical etching, may be used to form an opening in the first electromagnetic interference shielding layer adjacent to the connector(s) (if applicable) embedded in the molding compound.

At a third operation 430, an insulation layer may be applied about the first electromagnetic interference shielding layer. The insulation layer may be mounted, sprayed, coated, or otherwise disposed on the molding compound.

At a fourth operation 440, etching, such as laser or chemical etching, may be used to form an opening in the molding compound adjacent to the connector(s) (if applicable) embedded in the molding compound. The connector(s) may be exposed.

At a fifth operation 450, a second electromagnetic interference shielding layer may be applied to the system-in-package 340. The second electromagnetic interference shielding layer may be mounted, sprayed, coated, splattered, or otherwise disposed on the insulation layer. The second electromagnetic interference shielding layer may fill in the cavity formed by the etching at the fourth operation 440.

At a sixth operation 460, patterning may be performed to form a patterned structure on the second electromagnetic interference shielding layer. The patterning may be completed using laser etching, photo masking, or another suitable process. The system-in-package 340 may be complete thereafter.

Figure 5:
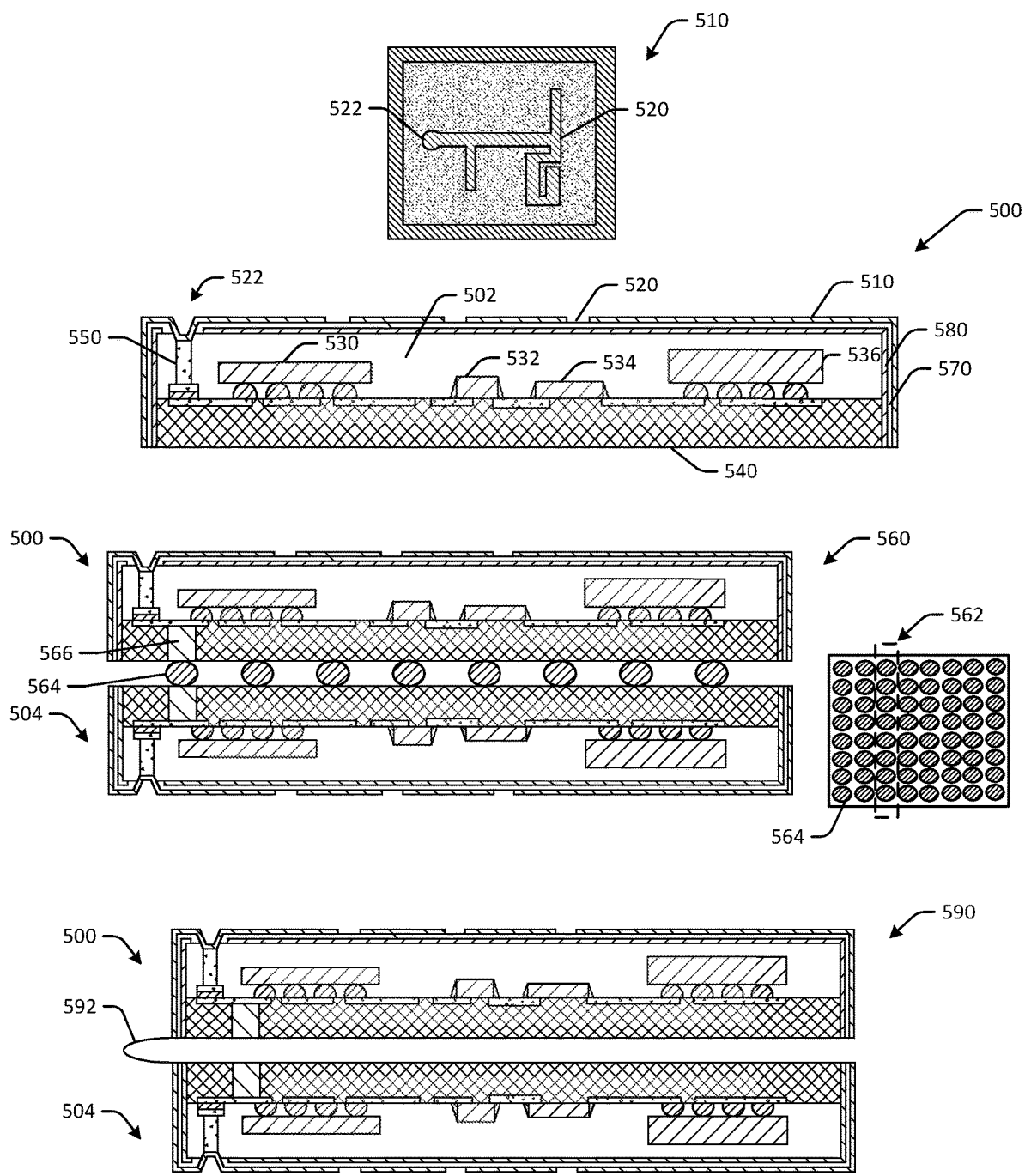
FIG. 5 is a schematic illustration of an example system-in-package having a radio frequency antenna patterned structure in various views in accordance with one or more embodiments of the disclosure.

FIG. 5 is a schematic illustration of an example system-in-package 500 having a radio frequency antenna patterned structure in various views in accordance with one or more embodiments of the disclosure. Other embodiments may include additional or fewer components. Other embodiments may include additional or fewer components. Other embodiments may have a different patterned structure than that depicted in the example of FIG. 5.

The systems-in-packages of FIG. 5 may be similar to the system-in-package 200 of FIG. 2, but may have different patterned structures, and may optionally include two or more discrete systems-in-packages, so as to form dual antenna structures. The systems-in-packages may therefore provide integrated antenna-related functionality. In FIG. 5, the patterned structure may be used to form various radio frequency antenna structures, such as WiFi antenna structures, NFC antenna structures, and so forth. Two systems-in-packages can be joined using, for example, solder ball or flexible cable connections to form a dual-antenna structure to improve antenna performance, and to reduce overall form factor of the module and device size.

In FIG. 5, the system-in-package 500 is depicted in top view, cross-sectional view, and close-up cross-sectional view. The system-in-package 500 may include an integrated antenna patterned structure disposed on an electromagnetic interference shielding layer, as described herein. The system-in-package 500 may be disposed inside a device housing, which may be formed of any suitable material, such as glass, plastic, rubber, composite, or a different type of material. For example, the device may include a flexible printed circuit. The flexible printed circuit may be arranged in a planar, flat, or unfolded configuration. The flexible printed circuit may include a number of conductive traces bonded on a flexible substrate. A number of components may be disposed on the flexible printed circuit, such as the system-in-package 500. The system-in-package 500 may be electrically coupled to the flexible printed circuit or other device component.

The system-in-package 500 may include a number of components. For example, the system-in-package 500 may include a substrate 540, such as a printed circuit board, a flexible circuit board, or other type of substrate. The system-in-package 500 may include one or more integrated circuit packages, such as a system-on-a-chip 536, one or more integrated circuits 532, one or more passive components 534, one or more WiFi integrated circuits 530, and/or other components, such as flip chip integrated circuits that are positioned on the substrate 540. A flip chip integrated circuit may be used to facilitate connections to other components of a device, such as other semiconductor components.

The system-in-package 500 may include a molding compound 502 disposed over the system-on-a-chip 536, the integrated circuit 532, and/or the other components disposed on the substrate 540, such as the one or more passive components 534 and the one or more WiFi integrated circuit 530. Accordingly, the components on the substrate 540 may be embedded in the molding compound 502. The molding compound 502 may be formed of a material such as a thermosetting material, thermoplastic material, or polymer-based material. The molding compound 502 may encompass or encapsulate the components of the system-in-package 500 that are disposed on the substrate 540.

The system-in-package 500 may include a first electromagnetic interference shield 580 disposed around an outer surface of the molding compound 502. The first electromagnetic interference shield 580 may be a fence, coating, or other component formed of a metal material and configured to prevent electromagnetic interference. The first electromagnetic interference shield 580 may form a layer around the molding compound 502. In some embodiments, the first electromagnetic interference shield 580 may be formed of more than one component, while in other embodiments, the first electromagnetic interference shield 580 may be a contiguous shield or single piece assembly. In some embodiments, the first electromagnetic interference shield 580 may have a multi-layer structure, such as a copper sublayer disposed between two steel sublayers. In other embodiments, the first electromagnetic interference shield 580 may have a single layer structure. The first electromagnetic interference shield 580 may be an inner electromagnetic interference shield.

The system-in-package 500 may include an insulation layer 570 disposed about the first electromagnetic interference shield 580. The insulation layer 570 may be formed of a non-conductive material, such as epoxy, molding compound, or another suitable material, and may separate the first electromagnetic interference shield 580 from other components, such as an outer electromagnetic interference shield. In some embodiments, the insulation layer 570 may be formed via an over-molding process.

The system-in-package 500 may include a second electromagnetic interference shield 510. The second electromagnetic interference shield 510 may be disposed about or around the insulation layer 570. The second electromagnetic interference shield 510 may form an outer layer of the system-in-package 500. The second electromagnetic interference shield 510 may be a fence, coating, or other component formed of a metal material and configured to prevent electromagnetic interference. The second electromagnetic interference shield 510 may form a layer around the insulation layer 570. In some embodiments, the second electromagnetic interference shield 510 may be formed of more than one component, while in other embodiments, the second electromagnetic interference shield 510 may be a contiguous shield or single piece assembly. In some embodiments, the second electromagnetic interference shield 510 may have a multi-layer structure, such as a copper sublayer disposed between two steel sublayers. In other embodiments, the second electromagnetic interference shield 510 may have a single layer structure and may be formed of, for example, copper. The second electromagnetic interference shield 510 may be an outer electromagnetic interference shield or may form an outer surface of the system-in-package 500.

A patterned structure 520 may be formed on the second electromagnetic interference shield 510. As depicted in the top view of the second electromagnetic interference shield 510 in FIG. 5, the patterned structure 520 may include a radio frequency antenna patterned structure. Other antenna structures may be used than that illustrated in FIG. 5. The patterned structure 520 may include an antenna pattern that extends to a first cavity 522 formed in the second electromagnetic interference shield 510. The patterned structure 520 may be formed using etching (e.g., chemical etching, etc.), laser, or another suitable process. The patterned structure 520 may form openings or gaps in the second electromagnetic interference shield 510 by extending through a thickness of the second electromagnetic interference shield 510, as visible in the cross-sectional view in FIG. 5.

A thickness of the second electromagnetic interference shield 510 may vary depending on the patterned structure 520 formed thereon and the related application, as well as the material used for the second electromagnetic interference shield 510. For example, for antenna-based functionality, the second electromagnetic interference shield 510 may have a thickness of about 4-5 microns. Other embodiments may have different thicknesses and/or may be formed of different materials.

In some embodiments, the first electromagnetic interference shield 580 may have a first thickness that is less than a second thickness of the second electromagnetic interference shield 510, whereas in other embodiments, the first electromagnetic interference shield 580 may have a first thickness that is greater than a second thickness of the second electromagnetic interference shield 510.

The system-in-package 500 may include one or more connectors to electrically couple the patterned structure 520 on the second electromagnetic interference shield 510 to one or more circuits on the substrate 540. For example, the system-in-package 500 may include a first connector 550 that extends between the patterned structure 520 of the second electromagnetic interference shield 510 and the substrate 540. The first connector 550 may be formed of a conductive material, such as copper. The first connector 550 may be disposed adjacent to the first cavity 522. The first connector 550 may be mounted using a selective molding or surface mount technology process, as described with respect to FIGS. 3-4. The first connector 550 may form an interconnection between the circuit on the substrate 540 and the patterned structure 520 on the second electromagnetic interference shield 510. The first connector 550 may be disposed in, or otherwise pass through, the molding compound 502. Unlike the embodiment of FIG. 2, the system-in-package 500 may not include a second connector.

The system-in-package 500 may include an optional cover layer disposed over the second electromagnetic interference shield 510. The cover layer may be for protective purposes and may be formed as a plastic film, a tape, etc. to isolate the patterned structure 520 from an ambient environment.

The system-in-package 500 may be coupled to another system-in-package having the same or a different antenna pattern for dual-antenna functionality. For example, in a first dual-antenna embodiment 560, the system-in-package 500 may be coupled to a second system-in-package 504 using one or more solder connections, such as solder balls 564, that electrically couple circuits together using one or more plated through holes or vias 566 of the system-in-package 500. The solder balls 564 are depicted in a planar view in FIG. 5 and may be arranged in rows and columns, such as a first column 562, and may form an array. Some embodiments may have an 8×8 array formation.

In a second dual-antenna embodiment 590, the system-in-package 500 may be coupled to the second system-in-package 504 using one or more flexible cable connections 592 that electrically couple the circuits together. In some embodiments, the two systems-in-packages may be stacked in a vertical stacked arrangement as illustrated, whereas in other embodiments, the two systems-in-packages may be in a side-by-side arrangement.

In dual-antenna embodiments, the respective patterned structures may be different. For example, a first patterned structure of the first system-in-package may be different than a second patterned structure of the second system-in-package.

Figure 6:
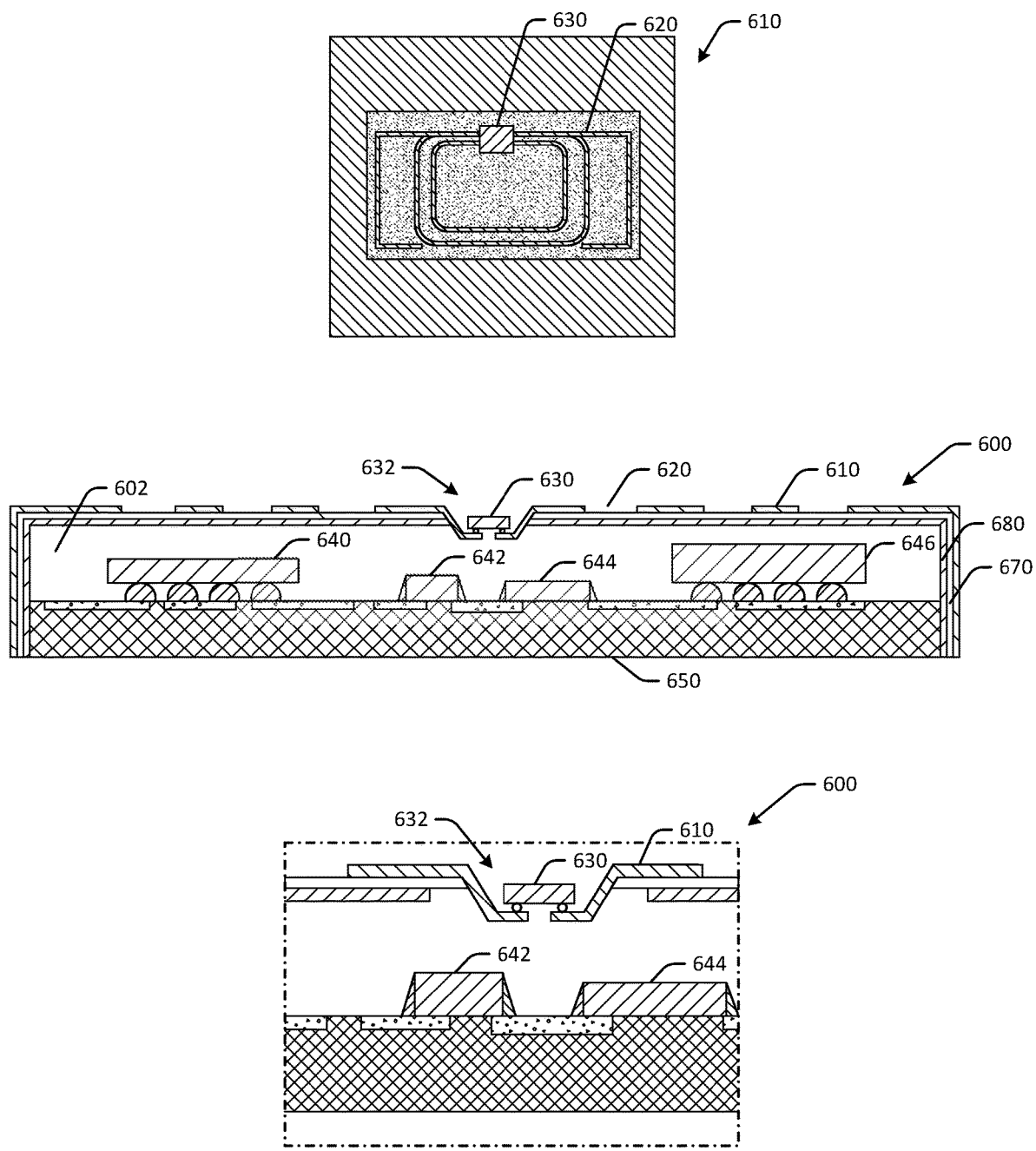
FIG. 6 is a schematic illustration of an example system-in-package having an RFID patterned structure in various views in accordance with one or more embodiments of the disclosure.

FIG. 6 is a schematic illustration of an example system-in-package 600 having an RFID patterned structure in various views in accordance with one or more embodiments of the disclosure. Other embodiments may include additional or fewer components. Other embodiments may include additional or fewer components. Other embodiments may have a different patterned structure than that depicted in the example of FIG. 6.

The system-in-package of FIG. 6 may be similar to the systems-in-packages of FIGS. 1-5, but may have different patterned structures, and may not include connectors due to the passive powering of the RFID tags. Other embodiments may be configured for different communication hardware, such as for NFC communication, and may therefore include NFC tags and antennas. Other hardware may also be used for different short range or contactless communication protocols.

In FIG. 6, the system-in-package 600 is depicted in top view, cross-sectional view, and close-up cross-sectional view. The system-in-package 600 may include an RFID patterned structure disposed on an electromagnetic interference shielding layer, as described herein. The system-in-package 600 may be disposed inside a device housing, which may be formed of any suitable material, such as glass, plastic, rubber, composite, or a different type of material. For example, the device may include a flexible printed circuit. The flexible printed circuit may be arranged in a planar, flat, or unfolded configuration. The flexible printed circuit may include a number of conductive traces bonded on a flexible substrate. A number of components may be disposed on the flexible printed circuit, such as the system-in-package 600. The system-in-package 600 may be electrically coupled to the flexible printed circuit or other device component.

The system-in-package 600 may include a number of components. For example, the system-in-package 600 may include a substrate 650, such as a printed circuit board, a flexible circuit board, or other type of substrate. The system-in-package 600 may include one or more integrated circuit packages, such as a system-on-a-chip 640, one or more integrated circuits 642, one or more passive components 644, one or more additional integrated circuits 646, and/or other components, such as flip chip integrated circuits that are positioned on the substrate 650. A flip chip integrated circuit may be used to facilitate connections to other components of a device, such as other semiconductor components.

The system-in-package 600 may include a molding compound 602 disposed over the system-on-a-chip 640, the integrated circuit 642, and/or the other components disposed on the substrate 650, such as the one or more passive components 644 and the one or more additional integrated circuits 646. Accordingly, the components on the substrate 650 may be embedded in the molding compound 602. The molding compound 602 may be formed of a material such as a thermosetting material, thermoplastic material, or polymer-based material. The molding compound 602 may encompass or encapsulate the components of the system-in-package 600 that are disposed on the substrate 650.

The system-in-package 600 may include a first electromagnetic interference shield 680 disposed around an outer surface of the molding compound 602. The first electromagnetic interference shield 680 may be a fence, coating, or other component formed of a metal material and configured to prevent electromagnetic interference. The first electromagnetic interference shield 680 may form a layer around the molding compound 602. In some embodiments, the first electromagnetic interference shield 680 may be formed of more than one component, while in other embodiments, the first electromagnetic interference shield 680 may be a contiguous shield or single piece assembly. In some embodiments, the first electromagnetic interference shield 680 may have a multi-layer structure, such as a copper sublayer disposed between two steel sublayers. In other embodiments, the first electromagnetic interference shield 680 may have a single layer structure. The first electromagnetic interference shield 680 may be an inner electromagnetic interference shield.

The system-in-package 600 may include an insulation layer 670 disposed about the first electromagnetic interference shield 680. The insulation layer 670 may be formed of a non-conductive material, such as epoxy, molding compound, or another suitable material, and may separate the first electromagnetic interference shield 680 from other components, such as an outer electromagnetic interference shield. In some embodiments, the insulation layer 670 may be formed via an over-molding process.

The system-in-package 600 may include a second electromagnetic interference shield 610. The second electromagnetic interference shield 610 may be disposed about the insulation layer 670. The second electromagnetic interference shield 610 may form an outer layer of the system-in-package 600. The second electromagnetic interference shield 610 may be a fence, coating, or other component formed of a metal material and configured to prevent electromagnetic interference. The second electromagnetic interference shield 610 may form a layer around the insulation layer 670. In some embodiments, the second electromagnetic interference shield 610 may be formed of more than one component, while in other embodiments, the second electromagnetic interference shield 610 may be a contiguous shield or single piece assembly. In some embodiments, the second electromagnetic interference shield 610 may have a multi-layer structure, such as a copper sublayer disposed between two steel sublayers. In other embodiments, the second electromagnetic interference shield 610 may have a single layer structure and may be formed of, for example, copper. The second electromagnetic interference shield 610 may be an outer electromagnetic interference shield or may form an outer surface of the system-in-package 600.

A patterned structure 620 may be formed on the second electromagnetic interference shield 610. As depicted in the top view of the second electromagnetic interference shield 610 in FIG. 6, the patterned structure 620 may include a RFID patterned structure. Other RFID structures may be used than that illustrated in FIG. 6. The patterned structure 620 may include a pattern that is electrically coupled to an RFID tag 630. RFID tags may include a chip and an antenna for wireless identification of the objects they are attached to (or embedded in) when interacted with by an RFID reader.

The RFID tag 630 may be disposed on the second electromagnetic interference shield 610, and may be coupled to the patterned structure 620 of the second electromagnetic interference shield 610 using anisotropic conductive film bonding, or another suitable bonding method. For example, the RFID tag 630 may be disposed in a cavity 632 formed in the second electromagnetic interference shield 610. The patterned structure 620 may be formed using etching (e.g., chemical etching, etc.), laser, or another suitable process. The patterned structure 620 may form openings or gaps in the second electromagnetic interference shield 610 by extending through a thickness of the second electromagnetic interference shield 610, as visible in the cross-sectional view in FIG. 6.

A thickness of the second electromagnetic interference shield 610 may vary depending on the patterned structure 620 formed thereon and the related application, as well as the material used for the second electromagnetic interference shield 610. For example, for RFID-based functionality, the second electromagnetic interference shield 610 may have a thickness of about 4-5 microns. Other embodiments may have different thicknesses and/or may be formed of different materials.

In some embodiments, the first electromagnetic interference shield 680 may have a first thickness that is less than a second thickness of the second electromagnetic interference shield 610, whereas in other embodiments, the first electromagnetic interference shield 680 may have a first thickness that is greater than a second thickness of the second electromagnetic interference shield 610.

The system-in-package 600 may include an optional cover layer disposed over the second electromagnetic interference shield 610. The cover layer may be for protective purposes and may be formed as a plastic film, a tape, etc. to isolate the patterned structure 620 from an ambient environment.

One or more operations of the methods, process flows, or use cases of FIGS. 1-6 may have been described above as being performed by a user device, or more specifically, by one or more program module(s), applications, or the like executing on a device. It should be appreciated, however, that any of the operations of the methods, process flows, or use cases of FIGS. 1-6 may be performed, at least in part, in a distributed manner by one or more other devices, or more specifically, by one or more program module(s), applications, or the like executing on such devices (where appropriate). In addition, it should be appreciated that processing performed in response to the execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-6 may be described in the context of the illustrative devices, it should be appreciated that such operations may be implemented in connection with numerous other device configurations.

The operations described and depicted in the illustrative methods, process flows, or use cases of FIGS. 1-6 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-6 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Example Device Architecture

Figure 7:
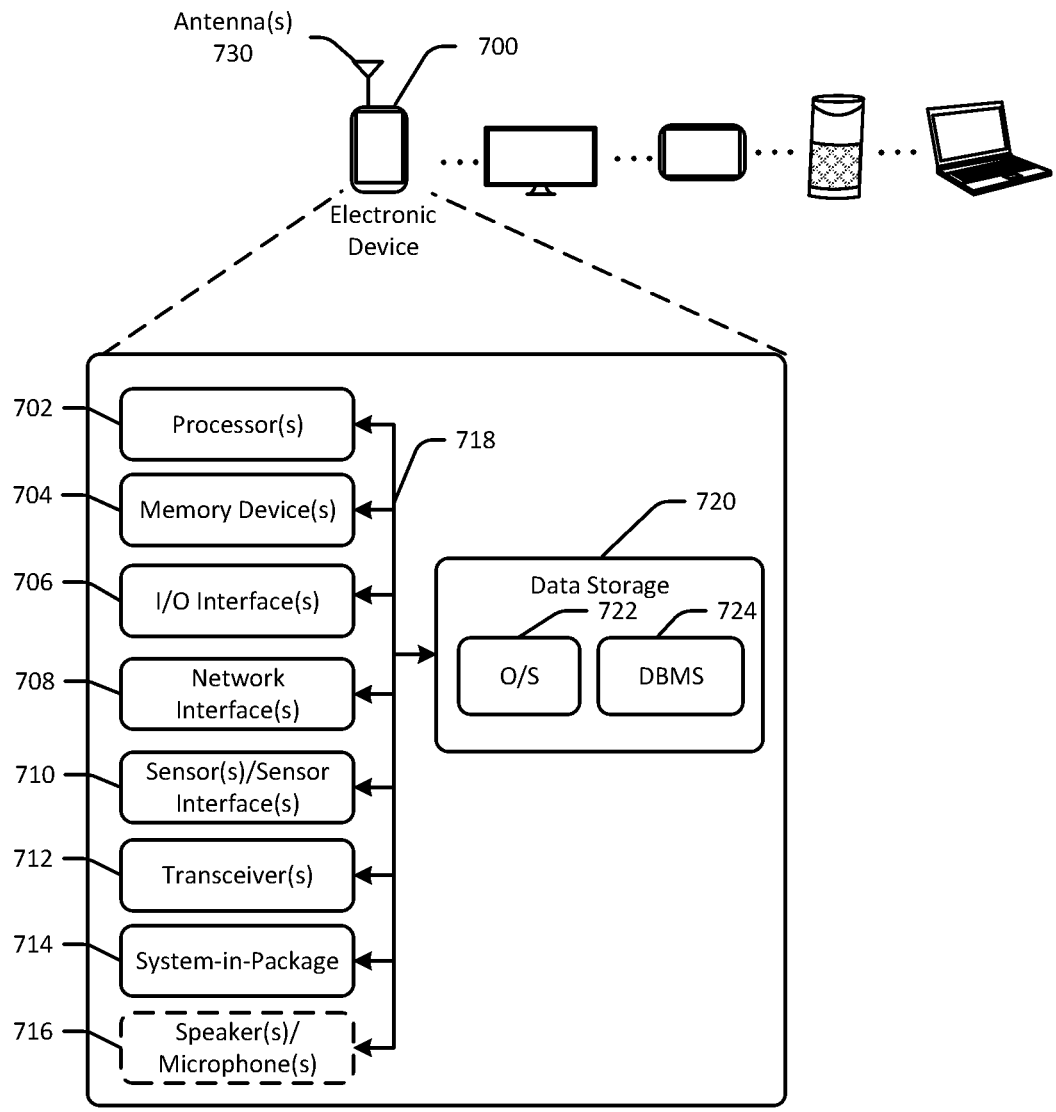
FIG. 7 schematically illustrates an example architecture of an electronic device in accordance with one or more embodiments of the disclosure.

FIG. 7 is a schematic block diagram of one or more illustrative electronic device(s) 700 in accordance with one or more example embodiments of the disclosure. The electronic device(s) 700 may include any suitable computing device including, but not limited to, a server system, a voice interaction device, a mobile device such as a smartphone, a tablet, an e-reader, a wearable device, or the like; a desktop computer; a laptop computer; a content streaming device; or the like. The electronic device(s) 700 may correspond to an illustrative device configuration for the device(s) that includes one or more of the system(s)-in-package(s) of FIGS. 1-6.

The electronic device(s) 700 may be configured to communicate with one or more servers, user devices, or the like. The electronic device(s) 700 may be configured to be coupled to one or more batteries, such as a lithium-ion battery. The electronic device(s) 700 may be configured to use a system(s)-in-package(s) to implement wireless coil charging, RF antenna, and/or RFID functionality at the device.

The electronic device(s) 700 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the electronic device(s) 700 may include one or more processors (processor(s)) 702, one or more memory devices 704 (also referred to herein as memory 704), one or more input/output (I/O) interface(s) 706, one or more network interface(s) 708, one or more sensor(s) or sensor interface(s) 710, one or more transceiver(s) 712, one or more system(s)-in-package(s) 714, one or more optional microphone(s) 716, and data storage 720. The electronic device(s) 700 may further include one or more bus(es) 718 that functionally couple various components of the electronic device(s) 700. The electronic device(s) 700 may further include one or more antenna(s) 730 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 718 may include at least one of a system bus, a memory bus, an address bus, or a message bus, and may permit the exchange of information (e.g., data (including computer-executable code), signaling, etc.) between various components of the electronic device(s) 700. The bus(es) 718 may include, without limitation, a memory bus or a memory controller, a peripheral bus, an accelerated graphics port, and so forth. The bus(es) 718 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 704 of the electronic device(s) 700 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 704 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 704 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 720 may include removable storage and/or non-removable storage including, but not limited to, magnetic storage, optical disk storage, and/or tape storage. The data storage 720 may provide non-volatile storage of computer-executable instructions and other data. The memory 704 and the data storage 720, removable and/or non-removable, are examples of computer-readable storage media (CRSM) as that term is used herein.

The data storage 720 may store computer-executable code, instructions, or the like that may be loadable into the memory 704 and executable by the processor(s) 702 to cause the processor(s) 702 to perform or initiate various operations. The data storage 720 may additionally store data that may be copied to the memory 704 for use by the processor(s) 702 during the execution of the computer-executable instructions. Moreover, output data generated as a result of execution of the computer-executable instructions by the processor(s) 702 may be stored initially in the memory 704, and may ultimately be copied to the data storage 720 for non-volatile storage.

More specifically, the data storage 720 may store one or more operating systems (O/S) 722; one or more database management systems (DBMS) 724; and one or more program module(s), applications, engines, computer-executable code, scripts, or the like. Some or all of these module(s) may be sub-module(s). Any of the components depicted as being stored in the data storage 720 may include any combination of software, firmware, and/or hardware. The software and/or firmware may include computer-executable code, instructions, or the like that may be loaded into the memory 704 for execution by one or more of the processor(s) 702. Any of the components depicted as being stored in the data storage 720 may support functionality described in reference to corresponding components named earlier in this disclosure.

The data storage 720 may further store various types of data utilized by the components of the electronic device(s) 700. Any data stored in the data storage 720 may be loaded into the memory 704 for use by the processor(s) 702 in executing computer-executable code. In addition, any data depicted as being stored in the data storage 720 may potentially be stored in one or more datastore(s) and may be accessed via the DBMS 724 and loaded in the memory 704 for use by the processor(s) 702 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like.

The processor(s) 702 may be configured to access the memory 704 and execute the computer-executable instructions loaded therein. For example, the processor(s) 702 may be configured to execute the computer-executable instructions of the various program module(s), applications, engines, or the like of the electronic device(s) 700 to cause or facilitate various operations to be performed in accordance with one or more embodiments of the disclosure. The processor(s) 702 may include any suitable processing unit capable of accepting data as input, processing the input data in accordance with stored computer-executable instructions, and generating output data. The processor(s) 702 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 702 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 702 may be capable of supporting any of a variety of instruction sets.

Referring now to other illustrative components depicted as being stored in the data storage 720, the O/S 722 may be loaded from the data storage 720 into the memory 704 and may provide an interface between other application software executing on the electronic device(s) 700 and the hardware resources of the electronic device(s) 700. More specifically, the O/S 722 may include a set of computer-executable instructions for managing the hardware resources of the electronic device(s) 700 and for providing common services to other application programs (e.g., managing memory allocation among various application programs). In certain example embodiments, the O/S 722 may control execution of the other program module(s). The O/S 722 may include any operating system now known or which may be developed in the future including, but not limited to, any server operating system, any mainframe operating system, or any other proprietary or non-proprietary operating system.

The DBMS 724 may be loaded into the memory 704 and may support functionality for accessing, retrieving, storing, and/or manipulating data stored in the memory 704 and/or data stored in the data storage 720. The DBMS 724 may use any of a variety of database models (e.g., relational model, object model, etc.) and may support any of a variety of query languages. The DBMS 724 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 700 is a mobile device, the DBMS 724 may be any suitable lightweight DBMS optimized for performance on a mobile device.

Referring now to other illustrative components of the electronic device(s) 700, the input/output (I/O) interface(s) 706 may facilitate the receipt of input information by the electronic device(s) 700 from one or more I/O devices as well as the output of information from the electronic device(s) 700 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 700 or may be separate. The I/O devices may further include, for example, any number of peripheral devices such as data storage devices, printing devices, and so forth.

The I/O interface(s) 706 may also include an interface for an external peripheral device connection such as universal serial bus (USB), FireWire, Thunderbolt, Ethernet port or other connection protocol that may connect to one or more networks. The I/O interface(s) 706 may also include a connection to one or more of the antenna(s) 730 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The electronic device(s) 700 may further include one or more network interface(s) 708 via which the electronic device(s) 700 may communicate with any of a variety of other systems, platforms, networks, devices, and so forth. The network interface(s) 708 may enable communication, for example, with one or more wireless routers, one or more host servers, one or more web servers, and the like via one or more networks.

The antenna(s) 730 may include any suitable type of antenna depending, for example, on the communications protocols used to transmit or receive signals via the antenna(s) 730. Non-limiting examples of suitable antennas may include directional antennas, non-directional antennas, dipole antennas, folded dipole antennas, patch antennas, multiple-input multiple-output (MIMO) antennas, or the like. The antenna(s) 730 may be communicatively coupled to one or more transceivers 712 or radio components to which or from which signals may be transmitted or received.

As previously described, the antenna(s) 730 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(s) 730 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(s) 730 may be configured to transmit or receive radio frequency signals within any suitable frequency range forming part of the unlicensed portion of the radio spectrum.

The antenna(s) 730 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 712 may include any suitable radio component(s) for—in cooperation with the antenna(s) 730—transmitting or receiving radio frequency (RF) signals in the bandwidth and/or channels corresponding to the communications protocols utilized by the electronic device(s) 700 to communicate with other devices. The transceiver(s) 712 may include hardware, software, and/or firmware for modulating, transmitting, or receiving —potentially in cooperation with any of antenna(s) 730—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 712 may further include hardware, firmware, or software for receiving GNSS signals. The transceiver(s) 712 may include any known receiver and baseband suitable for communicating via the communications protocols utilized by the electronic device(s) 700. The transceiver(s) 712 may further include a low noise amplifier (LNA), additional signal amplifiers, an analog-to-digital (A/D) converter, one or more buffers, a digital baseband, or the like.

The sensor(s)/sensor interface(s) 710 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The system(s)-in-package(s) 714 may be any of the system(s)-in-package(s) described herein, and may include sensor(s) configured to facilitate wireless charging, RF antenna communication, RFID interactions, to determine characteristics of an ambient environment, to capture images, to output audio, and/or other functions. The system(s)-in-package(s) 714 may be coupled to a battery or other components. The optional speaker(s)/microphone(s) 716 may be any device configured to receive analog sound input or voice data.

It should be appreciated that the program module(s), applications, computer-executable instructions, code, or the like depicted in FIG. 7 as being stored in the data storage 720 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 700, and/or hosted on other computing device(s) accessible via one or more networks, may be provided to support functionality provided by the program module(s), applications, or computer-executable code depicted in FIG. 7 and/or additional or alternate functionality. Further, functionality may be modularized differently such that processing described as being supported collectively by the collection of program module(s) depicted in FIG. 7 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 7 may be implemented, at least partially, in hardware and/or firmware across any number of devices.

It should further be appreciated that the electronic device(s) 700 may include alternate and/or additional hardware, software, or firmware components beyond those described or depicted without departing from the scope of the disclosure. More particularly, it should be appreciated that software, firmware, or hardware components depicted as forming part of the electronic device(s) 700 are merely illustrative and that some components may not be present or additional components may be provided in various embodiments. While various illustrative program module(s) have been depicted and described as software module(s) stored in the data storage 720, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:
1. A wirelessly chargeable device comprising:
    a battery; and
    a system-in-package electrically coupled to the battery, the system-in-package comprising:
        a printed circuit board;
        a first integrated circuit chip disposed on the printed circuit board;
        a second integrated circuit chip disposed on the printed circuit board;
        a molding compound disposed over the first and the second integrated circuit chips;
        a first electromagnetic interference shielding layer disposed around an outer surface of the first molding compound;
        an insulating layer disposed over the first electromagnetic interference shielding layer;
        a second electromagnetic interference shielding layer disposed over the insulating layer and that forms an outer surface of the system-in-package, the second electromagnetic interference shielding layer comprising a wireless charging coil pattern formed thereon; and a first conductive component coupled to the second electromagnetic interference shielding layer and the printed circuit board.

2. The wirelessly chargeable device of claim 1, wherein the the first conductive component passes through the molding compound.

3. The wirelessly chargeable device of claim 1, wherein the system-in-package further comprises:

a second conductive component coupled to the second electromagnetic interference shielding layer and the printed circuit board, the second conductive component comprising copper, wherein the second conductive component passes through the molding compound;

wherein the wireless charging coil pattern starts adjacent to the first conductive component and ends adjacent to the second conductive component.

4. The wirelessly chargeable device of claim 3, wherein the system-in-package further comprises:

a first cavity aligned with the first conductive component, the first cavity formed in the second electromagnetic interference shielding layer, wherein the second electromagnetic interference shielding layer is in contact with the first conductive component; and a second cavity aligned with the second conductive component, the second cavity formed in the second electromagnetic interference shielding layer, wherein the second electromagnetic interference shielding layer is in contact with the second conductive component.

5. The wirelessly chargeable device of claim 1, wherein the first electromagnetic interference shielding layer has a first thickness that is less than a second thickness of the second electromagnetic interference shielding layer.

6. A system-in-package comprising:

a substrate;

a first integrated circuit (IC) disposed on the substrate;

a molding compound disposed over the first IC;

a first electromagnetic interference shielding component disposed about the molding compound;

an insulating layer disposed over the first electromagnetic interference shielding component;

a second electromagnetic interference shielding component disposed over the insulating layer and that at least partially forms an outer surface of the system-in-package, wherein the second electromagnetic interference shielding component comprises a patterned structure thereon; and a first connector coupled to the second electromagnetic interference shielding component and the substrate.

7. The system-in-package of claim 6, wherein the insulating layer comprises a non-conductive material.

8. The system-in-package of claim 6, wherein the first electromagnetic interference shielding component comprises a multi-layer structure, and wherein the second electromagnetic interference shielding component has a multi-layer structure.

9. The system-in-package of claim 6, further comprising:

a wireless charging chip disposed on the substrate; and wherein the patterned structure is a wireless charging coil pattern.

10. The system-in-package of claim 9, further comprising:

a second connector coupled to the second electromagnetic interference shielding component and the substrate;

wherein the wireless charging coil pattern starts adjacent to the first connector and ends adjacent to the second connector.

11. The system-in-package of claim 6, wherein the first IC is a wireless fidelity (WiFi) radio chip;

wherein the first connector is coupled to the second electromagnetic interference shielding component and the WiFi radio chip;

wherein the patterned structure is a radio frequency antenna coupled to the WiFi radio chip.

12. The system-in-package of claim 6, further comprising:

a cavity formed in the molding compound; and an RFID tag or an NFC tag disposed in the cavity and coupled to the second electromagnetic interference shielding component;

wherein the patterned structure is at least one of: (i) an RFID antenna that is coupled to the RFID tag, or (ii) an NFC antenna that is coupled to the NFC tag.

13. The system-in-package of claim 6, wherein the first electromagnetic interference shielding component has a first thickness that is less than a second thickness of the second electromagnetic interference shielding component.

14. The system-in-package of claim 6, further comprising:

a passive component disposed on the substrate;

wherein the first IC and the passive component are embedded in the molding compound.

15. A device comprising:

a battery; and a first system-in-package comprising:

a first substrate;

a first integrated circuit (IC);

a second IC;

a first molding compound disposed over the first IC and the second IC;

a first electromagnetic interference shielding component disposed about the first molding compound;

an insulating layer disposed over the first electromagnetic interference shielding component;

a second electromagnetic interference shielding component disposed over the insulating layer and that at least partially forms an outer surface of the first system-in-package, wherein the second electromagnetic interference shielding component comprises a first patterned structure thereon; and a first connector coupled to the second electromagnetic interference shielding component and the first substrate.

16. The device of claim 15, further comprising:

a second system-in-package comprising:

a second substrate;

a third IC;

a fourth IC;

a second molding compound disposed over the third IC and the fourth IC;

a third electromagnetic interference shielding component disposed about the second molding compound; and a fourth electromagnetic interference shielding component that at least partially forms an outer surface of the second system-in-package, wherein the fourth electromagnetic interference shielding component comprises a second patterned structure thereon.

17. The device of claim 16, wherein the first patterned structure is different than the second patterned structure.

18. The device of claim 16, wherein first patterned structure is a radio frequency antenna; and wherein the first system-in-package is coupled to the second system-in-package using one or more solder components to form a dual-antenna structure.

19. The device of claim 18, wherein the first system-in-package is in a stacked arrangement with the second system-in-package, such that the fourth electromagnetic interference shielding component is adjacent to the first substrate.

20. The device of claim 16, wherein first patterned structure is a radio frequency antenna pattern; and wherein the first system-in-package is coupled to the second system-in-package using a flexible cable to form a dual-antenna structure.

* * * * *